US006738921B2

(12) United States Patent
Lo et al.

(10) Patent No.: US 6,738,921 B2
(45) Date of Patent: May 18, 2004

(54) CLOCK CONTROLLER FOR AC SELF-TEST TIMING ANALYSIS OF LOGIC SYSTEM

(75) Inventors: Tinchee Lo, Fishkill, NY (US); John D. Flanagan, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 09/812,321

(22) Filed: Mar. 20, 2001

(65) Prior Publication Data

US 2002/0138157 A1 Sep. 26, 2002

(51) Int. Cl.[7] .............................. G06F 1/04; G06F 1/06; G06F 1/08
(52) U.S. Cl. .............................. 713/500; 700/1; 700/16; 700/90; 700/14; 714/726; 714/727; 714/731; 714/732; 714/733; 714/734; 713/400; 713/401; 713/601; 713/503; 713/600; 326/16; 326/29; 326/93; 702/117; 327/141; 327/258; 327/259; 327/295; 716/6
(58) Field of Search .............................. 700/1, 16, 14, 700/90; 713/500, 501, 502, 503, 400, 401, 600, 601; 714/731, 732, 733, 734, 726, 727; 326/16, 29, 93; 327/141, 258, 259, 295; 716/6; 702/117

(56) References Cited

U.S. PATENT DOCUMENTS

| 4,961,013 A | | 10/1990 | Obermeyer, Jr. et al. |
|---|---|---|---|
| 5,018,144 A | * | 5/1991 | Corr et al. .................. 714/731 |
| 5,206,861 A | | 4/1993 | Hannon et al. |
| 5,313,470 A | | 5/1994 | Simpson |
| 5,329,532 A | | 7/1994 | Ikeda et al. |
| 5,386,392 A | | 1/1995 | Cantiant et al. |
| 5,627,841 A | | 5/1997 | Nakamura |
| 5,724,287 A | * | 3/1998 | Takenaka .................... 365/191 |
| 5,805,611 A | | 9/1998 | McClure |
| 5,867,046 A | * | 2/1999 | Sugasawa .................... 327/258 |
| 5,867,409 A | | 2/1999 | Nozuyama |
| 5,920,575 A | * | 7/1999 | Gregor et al. ............... 714/726 |
| 6,070,260 A | | 5/2000 | Buch et al. |
| 6,073,246 A | * | 6/2000 | Song et al. .................. 713/401 |
| 6,073,261 A | | 6/2000 | Miller |
| 6,236,260 B1 | * | 5/2001 | Vest et al. .................... 327/536 |
| 6,381,704 B1 | * | 4/2002 | Cano et al. .................. 713/600 |
| 6,441,666 B1 | * | 8/2002 | Swanson et al. ............. 327/291 |
| 6,598,192 B1 | * | 7/2003 | McLaurin et al. .......... 714/726 |

OTHER PUBLICATIONS

Logic Design for a Shift Register Latch to Support AC Self–Testing of LSSD Circuitry, IBM Technical Disclosure Bulletin, Aug. 1984, Vol. 27, No. 3 pp. 1588–1591.

(List continued on next page.)

*Primary Examiner*—Ramesh Patel
*Assistant Examiner*—Douglas Shute
(74) *Attorney, Agent, or Firm*—Floyd A. Gonzalez, Esq.; Kevin P. Radigan, Esq.; Heslin Rothenberg Farley & Mesiti P.C.

(57) ABSTRACT

A clock controller and clock generating method are provided for AC self-test timing analysis of a logic system. The controller includes latch circuitry which receives a DC input signal at a data input, and a pair of continuous out-of-phase clock signals at capture and launch clock inputs thereof. The latch circuitry outputs two overlapping pulses responsive to the DC input signal going high. The two overlapping pulses are provided to waveform shaper circuitry which produces therefrom two non-overlapping pulses at clock speed of the logic system to be tested. The two non-overlapping pulses are a single pair of clock pulses which facilitate AC self-test timing analysis of the logic system.

20 Claims, 4 Drawing Sheets

OTHER PUBLICATIONS

Improved Boundary Scan Design for DLSI Circuit Testing, IBM Technical Disclosure Bulletin, Vol. 37, No. 06A, Jun. 1994, pp. 3–9.

Method to Scan a Dual–Clocked LSSD Design, IBM Technical Disclosure Bulletin, Vol. 33, No. 4, Sept. 1990, pp. 117–119.

* cited by examiner

| MODE | OSC | GATE (B&C) | BPIN | CPIN | C2 | C1 |
|---|---|---|---|---|---|---|
| FUNCTIONAL | 0 | 0 | 1 | 1 | 0 | 1 |
|  | 1 | 0 | 1 | 1 | 1 | 0 |
| TEST | X | 1 | 1 | 1 | 1 | 1 |
|  | X | 1 | 0 | 1 | 0 | 1 |
|  | X | 1 | 1 | 0 | 1 | 0 |
|  | X | X | 0 | 0 | 0 | 0 |

CLOCK CONTROLLER FOR AC SELF-TEST TIMING ANALYSIS OF LOGIC SYSTEM

GOVERNMENT RIGHTS NOTICE

This invention was made with Government support under subcontract B338307 under prime contract W-7405-ENG-48 awarded by the Department of Energy. The Government has certain rights in the invention.

TECHNICAL FIELD

The present invention generally relates to computer logic system testing and, more particularly, to AC self-testing of logic systems utilized in, for example, large, complex digital computer systems implemented with high density, large scale integrated circuits.

BACKGROUND OF THE INVENTION

The design and manufacture of integrated circuits which are free of design and reliability problems is a challenging task. It is standard practice to test integrated circuits for "hard" functional failures as well as propensities to reliability problems. Such device testing is critical for identifying, analyzing, and correcting problem areas early.

Today, the Giga-Hertz era is beginning, and testing the timing critical paths at wafer level has become an important objective. Traditional wafer tests include flush testing, scan ring testing, DC stuck fault testing, random pattern testing, etc., all of which are conducted at low frequencies. For example, reference: Eichelberger et al., "A Logic Design Structure for LSI Testability," Proceedings of the 14th Design Automation Conference, New Orleans, pp. 462–468 (1977); and Foote et al., "Testing the 400 MHz IBM Generation-4 CMOS Chip," Proceedings of the International Test Conference 1997, Washington, D.C., pp. 106–114.

Screening out integrated circuit chips with timing problems has become essential as the number of integrated circuit chips which would pass low frequency testing but fail high frequency testing continues to increase Therefore, a means to perform an AC self-test on an integrated circuit, even at wafer level, has become more important.

DISCLOSURE OF THE INVENTION

One strategy for performing AC self-testing of a logic system would be as follows. A logic chip is first scanned with a set of pseudo-random data into its L1-latches by means of pulsing alternately the A-clock and the C2-clock (also known as the B-clock) in a known manner. The alternate pulsing is followed by a single pair of C2-clock and C1-clock signals at operating frequency. The single C2-clock pulse launches the scanned-in data through all timing paths, including the critical ones. The launched data is then captured by the subsequent single C1 clock pulse. If the data arrives on time, the C1 clock pulse will capture the data correctly. Data integrity is then checked by scanning out the captured data through alternating A-clock and B-clock pulses. Thus, the problem of doing AC testing is a challenge of designing a timing controller which generates a single pair of C1 and C2 clock pulses at operating speed. The present invention is directed to meeting this need without requiring a starting and stopping of the continuous clock signal driving the logic system.

Briefly summarized, provided herein is a clock controller which includes means for generating two overlapping pulses from a single continuous clock signal and a single DC input signal, as well as means for shaping the two overlapping pulses. The means for generating is responsive to the single DC input signal going high, and the means for shaping shapes the two overlapping pulses to produce two non-overlapping pulses at clock speed. The two non-overlapping clock pulses at clock speed comprise a single pair of clock pulses, C1 and C2, which can be used in performing AC testing of the logic system.

In another aspect, a clock controller for generating a single pair of clock pulses is provided. This clock controller includes latch circuitry and waveform shaper circuitry. The latch circuitry has a DC input signal connected to a data input, and a pair of continuous out-of-phase clock signals connected to capture and launch clock inputs thereof. The latch circuitry outputs two overlapping pulses. The waveform shaper circuitry is connected to receive the two overlapping pulses and produce therefrom two non-overlapping pulses. The two non-overlapping pulses comprise a single pair of clock pulses, C1 and C2, approximately at clock speed of a logic system to be tested. The clock controller produces the single pair of clock pulses from the DC input signal and the pair of continuous out-of-phase clock signals.

In still another aspect, a method for generating a single pair of clock pulses is presented. The method includes: generating two overlapping pulses from a single continuous clock signal and a single DC input signal, the generating being responsive to the single DC input signal going high; and shaping the two overlapping pulses to produce two non-overlapping pulses at clock speed, the two non-overlapping pulses at clock speed comprising a single pair of clock pulses, wherein the single pair of clock pulses is useful in AC self-testing a logic system driven by the single continuous clock signal without requiring discontinuance of the single continuous clock signal.

In a further aspect, a method of AC self-testing a logic system is presented. This method includes: scanning a set of data into at least some latches of the logic system; generating a single pair of clock pulses at operating frequency without gating off an oscillator used to drive the logic system; and employing the single pair of clock pulses to launch scanned in data from a first set of latches and capture the data at a second set of latches of the logic system.

To restate, presented herein is a novel clock controller and clock generation method which produces a single pair of pulses at clock speed without requiring manipulation of the clock signal gating a logic system to be tested. The generation of the non-overlapping clock pulse-pair is used to perform a single step AC test and can be accomplished on chip, i.e., on the logic chip to be tested. No external gating of the oscillator driving the chip is required. This is significant because using external equipment to turn on and off the oscillator input pin may produce a pulse pair with distorted waveforms due to the existence of a relatively long cable that feeds the chip from the external clock source. Any distorted waveforms of the pulse-pair would give rise to erroneous measurement of the AC speed and hence defeat the purpose of the AC testing of the logic system. In accordance with the present invention, the pulse-pair is generated similar to the clock pulses in a real chip functional operation.

The basic structure of the "clock splitters and registers" infrastructure remains intact without being disturbed by the embedding of AC test logic in accordance with the present invention. The clock control and testing scheme of the present invention is totally transparent to logic designers and somewhat transparent to the clock tree designers. Only the chip integrator and physical layout engineer need to be concerned with the insertion of the logic for the present invention into the chip. This has an advantage from a design methodology point of view.

In addition, the DC RELEASE signal inputted to the clock controller logic is not timing critical. The positive-going transition of the RELEASE signal triggers the generation of a pulse-pair. This non-criticality is significant because the pulse-pair generated is independent of how the RELEASE signal is raised. The waveform of the internal RELEASE (output of Latch 1 of FIG. 4) is not affected by the rise time of the external RELEASE signal (DIN of Latch 1 of FIG.4).

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings in which:

BEST MODE FOR CARRYING OUT THE INVENTION

Figures 1, 2:
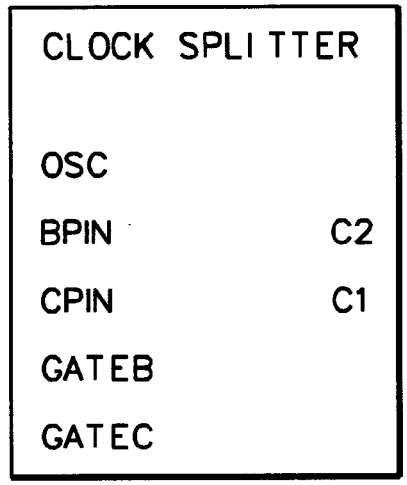
FIG. 1 is block diagram of a clock splitter logic showing inputs and outputs thereof to be driven by a clock controller in accordance with the principles of present invention.
FIG. 2 is a table of "functional" and "test" modes of a clock splitter of FIG. 1.

Referring now to the drawings, and more particularly to FIG. 1, there is shown a representation of a clock splitter. Many such clock splitters are placed strategically on-chip over the clock tree of a logic system. Each clock splitter drives multiple latches, for example, L1/L2 level sensitive scannable latches (SRLs). The main clock signal, which is derived from a phase lock loop macro, drives the oscillator (OSC) input pin of the clock splitter. There are four control signals BPIN, CPIN, GATEB and GATEC. In many applications, GATEB and GATEC are combined as a single control signal called GATE. Through the combination of the control signals, the OSC signal can be split into two out-of-phase signals, C1 and C2, which are output from the clock splitter and used to drive the on-chip latches during test and functional modes. The table of FIG. 2 illustrates the states of the inputs and outputs of the clock splitter during these various modes. Functional mode refers to an operating mode wherein the oscillator is continuously running, while in test mode the oscillator is removed from affecting the generation of C2 and C1. In the AC test mode described in this invention, the oscillator (however) is continuously running, but control logic is used to extract a pair of pulses within one cycle of the oscillator.

Various tests can be performed using the clock splitter of FIGS. 1 & 2. During test mode, the GATE signal is set to '1'. When both BPIN and CPIN are also set to '1', a flush function is performed in which the scan-in and scan-out pins of the chip are supposed to be short circuited, indicating the ring is continuous. Not shown is another clock called "A-clock" which drives the latches directly. When A-clock and BPIN are pulsing alternately at low frequencies, a scan function test is performed.

Low frequency functionally wafer testing can also be performed in one of two ways. First, while maintaining the GATE signal at '1', the BPIN and CPIN may be pulsed alternately at slow speed. BPIN thus becomes the C2 clock and CPIN becomes the C1 clock signal. Alternately, functional wafer testing can be performed by keeping both BPIN and CPIN high, and the GATE signal low during the test, and applying a low frequency oscillator signal to the OSC pins of the clock splitters. A final product functional test can be performed the same as noted above except the oscillator is running at the specified operating speed.

One strategy for performing AC self testing would be as follows:

the logic system is first scanned with a set of pseudo-random data into each of its L1 latches by means of pulsing alternately the A-clock and the BPIN, with GATE at '1' and CPIN at '0';

a single pair of C2-clock and C1-clock signals is generated at operating frequency (pursuant to the present invention);

the single C2-clock pulse is used to launch the scanned-in data through the timing paths including the critical timing paths;

the launched data is then captured by the subsequent single C1-clock pulse (and if the data arrives on time, C1-clock will capture the data correctly); and data integrity is checked by scanning out the captured data through alternating A-clock and BPIN with GATE at '1' and CPIN at '0'.

The present invention is directed to the problem of providing the single pair of C1 and C2 clock pulses at operating speed without requiring discontinuance of the oscillator signal. Clock controller logic is provided in FIGS. 3 & 4 to accomplish this function.

Figure 3:
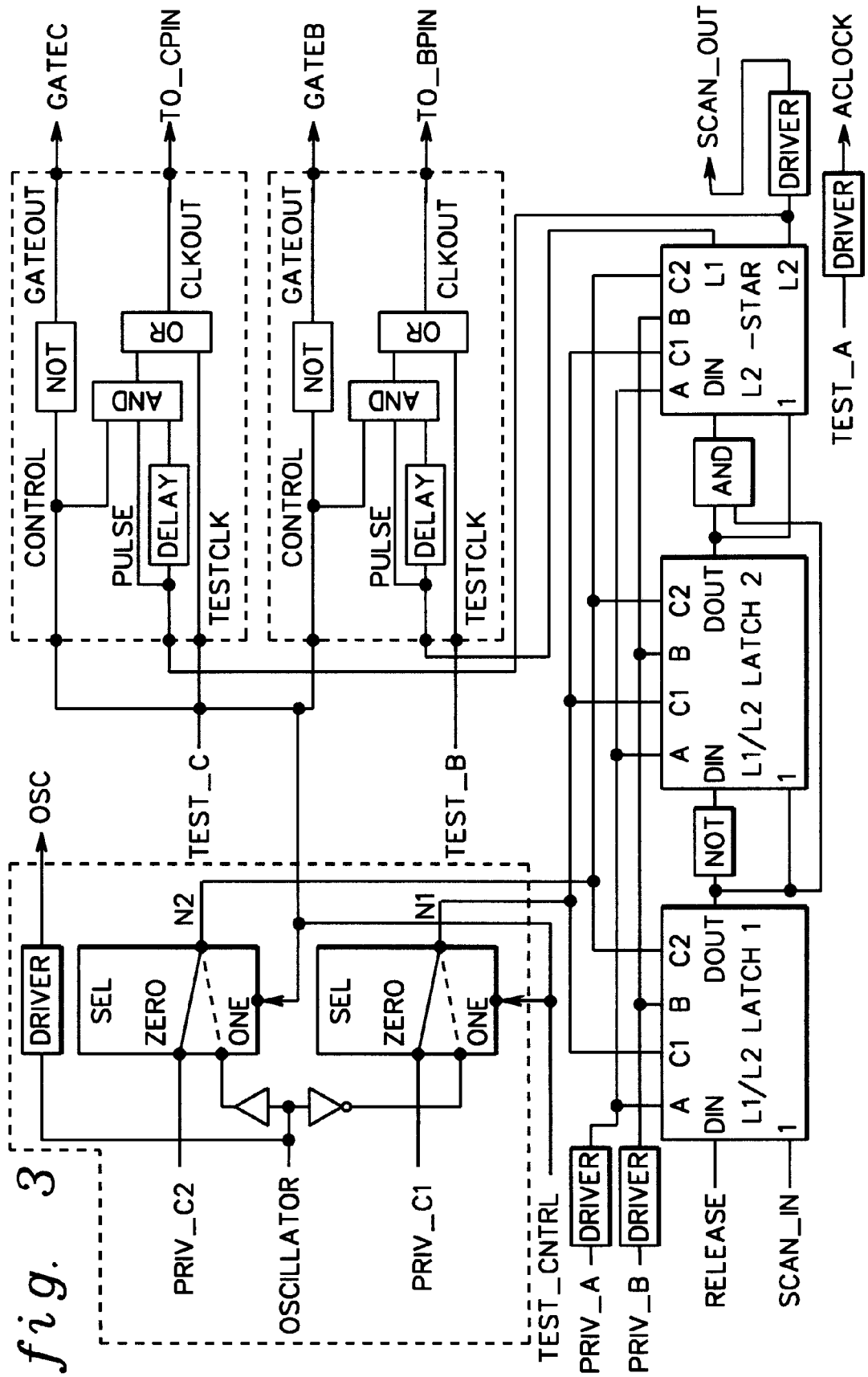
FIG. 3 is a detailed logic diagram for AC test clock controller circuitry in accordance with the principles of present invention, including circuitry for testing of the test circuitry.
Figure 4:
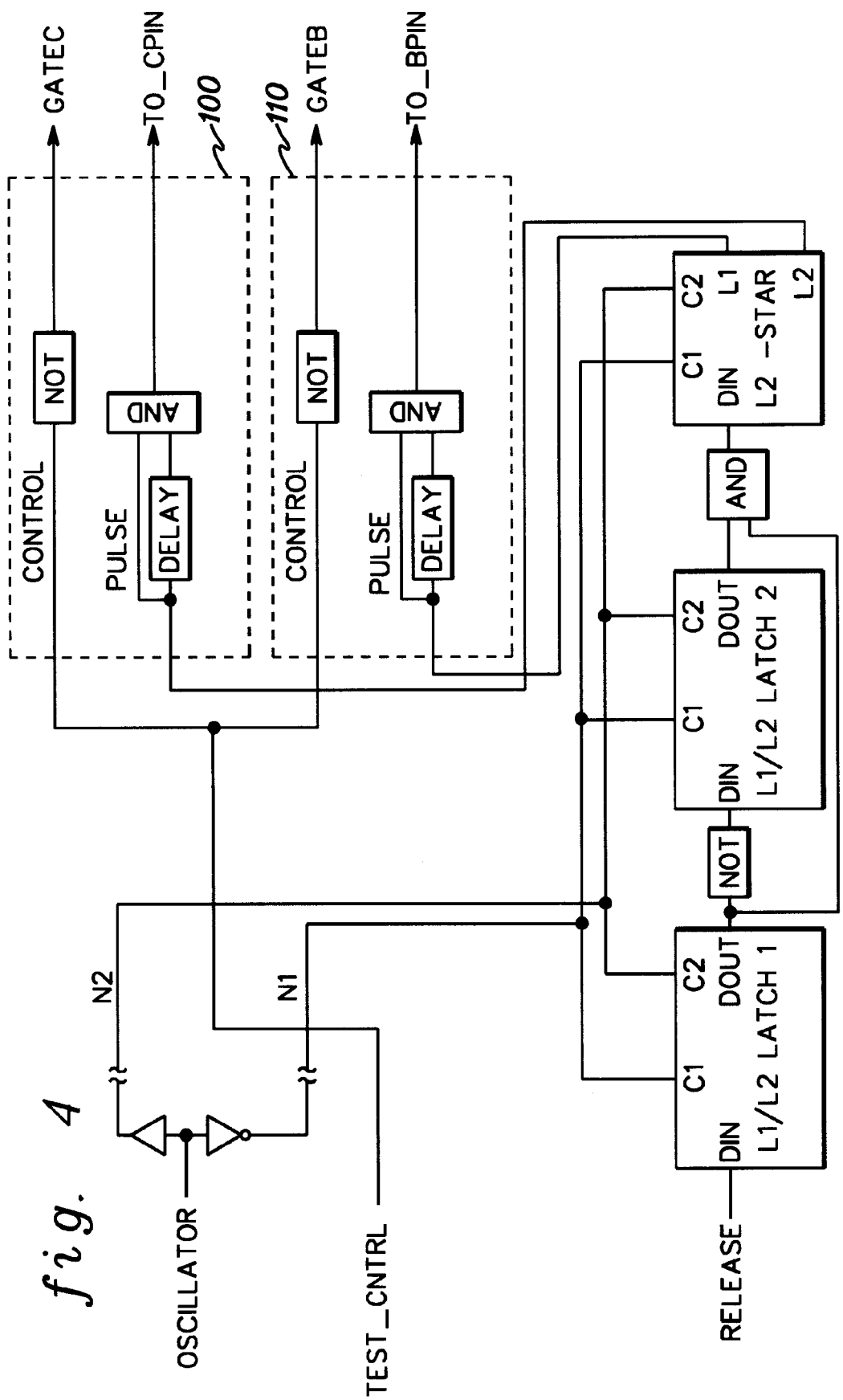
FIG. 4 is a simplified logic diagram of the circuitry of FIG. 3 showing one embodiment of a clock controller in accordance with the present invention.

FIG. 3 is presented for completeness and includes logic for testing the clock controller logic itself. This logical includes the PRIV_A, PRIV_B, PRIV_C1, & PRIV_C2 inputs. In addition, the TEST_A, TEST_B and TEST_C inputs, as well as the scan-in and scan-out signals, are presented for completeness to one skilled in the art, but are not relevant to the particular technique for generating a single pair of clock pulses at operating frequency for AC self-testing described hereinbelow. FIG. 4, which is a simplified schematic of the logic of FIG. 3 (with logic unrelated to the present invention removed), is described in detail below.

As shown in FIG. 2, the fact that both the C1 and C2 clocks can be suppressed by applying '0' to both BPIN and CPIN terminals makes single cycle AC self-test possible. In this mode, a TEST_CNTRL signal is maintained at DC 1, which results in a net clock N1 and N2 defining a pair of out-of-phase signals derived from the OSCILLATOR. These signals are to be applied to the C1 and C2 terminal inputs of three logic latches connected as shown in FIGS. 3 & 4. Note that by maintaining TEST_CNTRL high, the select logic of FIG. 3 goes away resulting in a single continuous oscillator signal being inputted to a buffer and a inverted buffer resulting in the two 180° out-of-phase signals from the one oscillator signal. In addition, TEST_CNTRL being high also results in GATEB and GATEC inputs being '0' as shown in FIG. 4, i.e., by passing the high signal through NOT logic within waveform shapers 100 & 110. This is a required condition for a functional AC self-test as shown in the table of FIG. 2. These two outputs of the waveform shapers 100 & 110 (also known as GATE in FIG. 2) are applied to the inputs of the clock splitters in the clock tree of the logic system to be tested.

In accordance with one embodiment of the present invention, a single pair of pulses at operational clock frequency are generated from a single continuous clock signal and a single DC input signal. In this embodiment, the single continuous clock signal comprises the oscillator signal which is used to generate the two net clocks N1 & N2. The DC input signal is labeled RELEASE and comprises the input to the data in (DIN) of a first latch (Latch 1) as shown in FIG. 4. The C1 input to Latch 1, as well as the C1 input to a Latch 2 and a Latch Star, is tied to receive the N1 net clock signal, while the C2 input to these latches is tied to receive the N2 net clock signal. The data out (D OUT) of Latch 1 is fed through NOT logic to the data in of Latch 2 and also to a first input of AND logic disposed between Latch 2 and Latch Star. The data out of Latch 2 is fed to a second input of the AND logic, and the output of the AND logic is presented to the data in of the Latch Star. The Latch Star includes two outputs, labeled L1 and L2. In accordance with the present invention, two overlapping pulses are created at L1 and L2 when the DC RELEASE signal goes high. These overlapping pulses are provided to the pulse inputs of the wave shapers 100 & 110. As shown, each shaper creates a delayed version of the pulse signal, and AND's the delayed version with the original pulse signal to create a shorter pulse signal that is output to either the BPIN or CPIN of the corresponding clock splitter(s).

Figure 5:
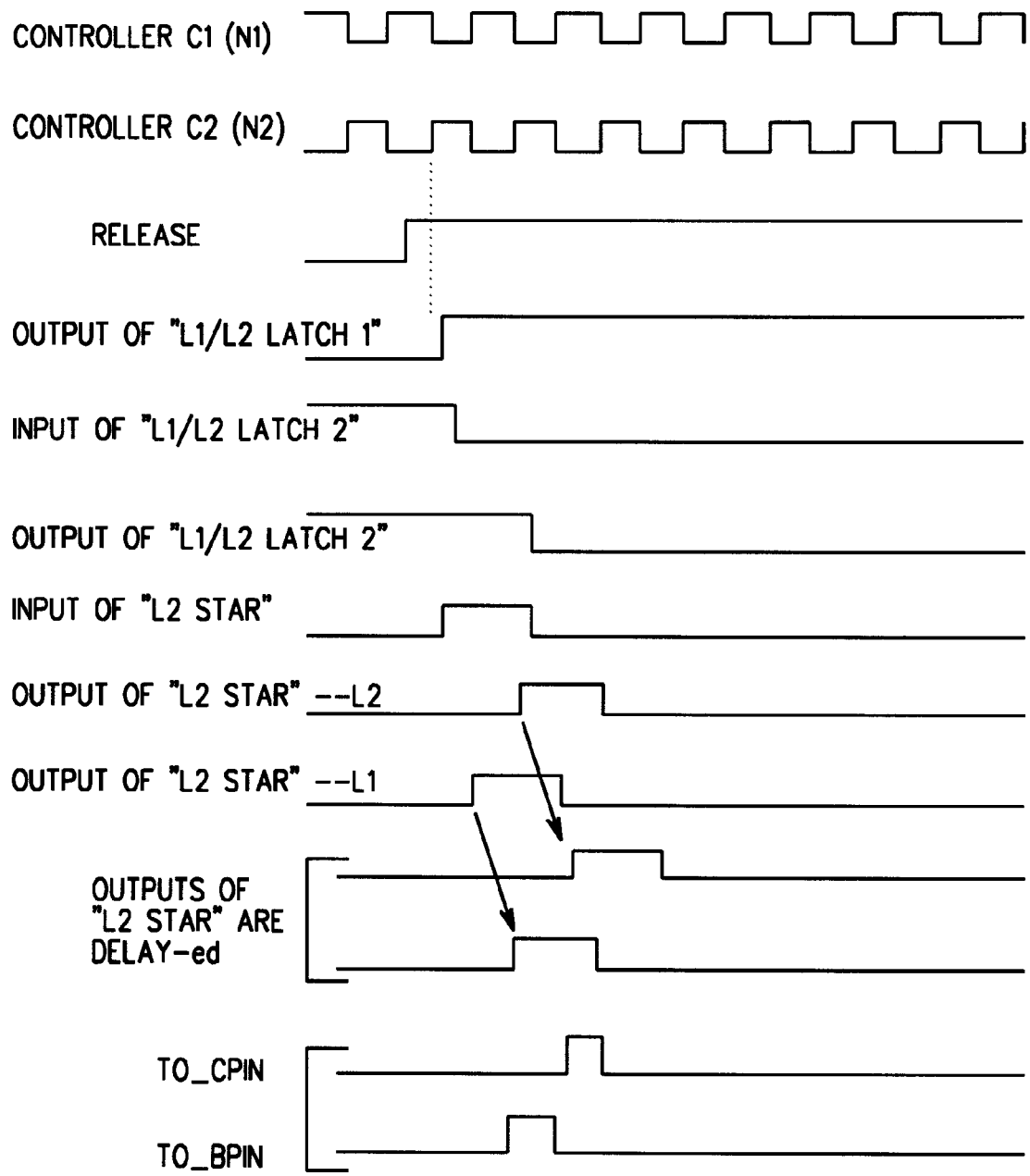
FIG. 5 is a timing diagram illustrating clock pulse creation using the clock controller circuitry of FIG. 4.

The operation of the logic of FIG. 4 will be more apparent with reference to the timing diagram of FIG. 5. The RELEASE signal, which drives the data in of the "L1/L2" Latch "1" is normally low. When turned to "1", the RELEASE signal produces two pulses at the outputs of the "L2-Star" latch. Referring to FIG. 5, the two continuous launch and capture clocks (N1) and (N2) are shown, followed by a RELEASE signal which goes high at some asynchronous point. The high signal at the data in to L1/L2 Latch 1 is recognized by Latch 1 when the capture signal C2 goes high following transmission of the high RELEASE signal, and some inherent circuit delay. The resultant output signal from L1/L2 Latch 1 is shown in the timing diagram. The input of L1/L2 Latch 2 is the inverse of this signal, and again appears at the input to the second latch after a slight circuit delay. The output of the L1/L2 Latch 2 follows the input after the capture clock C2 goes high, as well as after certain circuit latency. The input of the L2 Star Latch sees the output of the AND logic which has as inputs the output of the L1 Latch and the output of the L2 Latch. As shown in the timing diagram, this results in a pulse being presented to the input of the L2 Star Latch. The L1 output of the "L2-Star" Latch is launched by the N1 signal (i.e., C1 of the L2-Star Latch) and the L2 output of the "L2-Star" Latch is launched by the N2 signal (C2 of the L2-Star Latch). As shown, these two pulse signals are overlapping, and must therefore undergo further wave shaping.

This pair of overlapping pulses is fed to the 'pulse' inputs of two waveform shapers 100 & 110 of FIG. 4. As noted, within each waveform shaper there is a delay element. This delay element will shape the input wave applied to the terminal called "pulse". As shown in the timing diagram, the two delayed outputs of the L2 Star latch are respectively summed to the non-delayed outputs, resulting in truncated pulses shown at the bottom of the waveform drawings (and labeled TO_CPIN and TO_BPIN). The TO_BPIN signal is applied to the BPIN of the clock splitter(s) and the TO_CPIN signal is applied to the CPIN of the clock splitter(s).

Thus, at the bottom of the timing diagram, a single pair of non-overlapping pulses has been generated. These pulses represent the desired single step C2 and C1 clock respectively. During AC self-testing, all registers on a logic chip are first scanned in with a set of known data. Scanning is done by pulsing the A-clock and C2-clock at slow speed ending with the A-clock being the last to pulse. To perform the AC test, the oscillator is running at full functional speed, TEST_CNTRL is kept at "1", RELEASE is initialized at DC '0' and then switched to DC '1'. As shown at the bottom of the timing diagram of FIG. 5, the "TO_BPIN" pulse is activated first which is the system C2 clock responsible for launching data. If all the data arrive at the next registers on time, the "TO_CPIN" pulse, which is the system C1 clock, will capture the data and store the data in the L1 part of the downstream registers. The correctness of the transferred data can then be checked by scanning out the entire chip in a well known manner. Advantageously, the AC self-test timing control presented hereinabove does not require the gating-off of the main oscillator used to drive the chip, nor the extensive control circuitry otherwise required to derive a single pair of C1 and C2 pulses for AC self-testing.

Those skilled in the art will note from the above description that generation of the non-overlapping clock pulse-pair described herein can be accomplished "on" the logic chip to undergo the single-step AC test. That is, no external gating of the chip's oscillator input is required. Further, the basic structure of the "clock-splitters and registers" infrastructure remains intact, without being disturbed by the embedding of the AC test logic of FIGS. 3 & 4. Finally, the RELEASE input signal is not timing critical. This non-criticality is significant because the pulse-pair generated is independent of how the RELEASE signal is raised. The waveform of the internal RELEASE (DOUT of Latch 1) is not affected by the rise time of the external RELEASE signal (DIN of Latch 1).

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

What is claimed is:

1. A clock controller comprising:

means for generating two overlapping pulses from a single continuous clock signal and a single DC input signal, said means for generating outputting said two overlapping pulses responsive to said single DC input signal going high; and means for shaping said two overlapping pulses to produce two non-overlapping pulses, said two non-overlapping pulses comprising a single pair of clock pulses spaced approximately at clock speed of said single continuous clock signal.

2. The clock controller of claim 1, further comprising means for employing said single pair of clock pulses to AC test a logic system without discontinuing said single continuous clock signal, said single continuous clock signal driving said logic system.

3. The clock controller of claim 1, wherein said means for generating comprises means for generating a pair of continuous out-of-phase clock signals from said single continuous clock signal, and means for using said pair of continuous out-of-phase clock signals and said single DC input signal to generate said two overlapping pulses.

4. The clock controller of claim 1, wherein said means for shaping comprises means for outputting said single pair of clock pulses to CPIN and BPIN inputs of a clock splitter circuit of a logic system which is to undergo AC self-testing.

5. A clock controller for generating a pair of clock pulses, said clock controller comprising:

latch circuitry, said latch circuitry receiving a DC input signal at a data input, and a pair of continuous out-of-phase clock signals at capture and launch clock inputs thereof, said latch circuitry outputting two overlapping pulses responsive to said DC input signal going high;

waveform shaper circuitry connected to receive said two overlapping pulses and produce therefrom two non-overlapping pulses, said two non-overlapping pulses comprising said pair of clock pulses; and wherein said clock controller produces said pair of clock pulses from said DC input signal and said pair of continuous out-of-phase clock signals.

6. The clock controller of claim 5, wherein said pair of clock pulses comprises a single pair of pulses spaced at approximately clock speed of a logic system to be tested.

7. The clock controller of claim 5, further comprising means for generating said continuous out-of-phase clock signals from a single continuous running oscillation signal.

8. The clock controller of claim 5, wherein said latch circuitry comprises a L1/L2-latch 1, a L1/L2-latch 2, and a L2-Star latch, and wherein said DC input signal is received at a data input of said L1/L2-latch 1, an output of said L1/L2-latch 1 is connected to an input of said L1/L2-latch 2 across NOT logic, and an output of said L1/L2-latch 2 and the output of said L1/L2-latch 1 are connected to inputs of AND logic, an output of said AND logic being connected to an input of said L2-Star latch, and wherein said L2-Star latch has a first output and a second output for outputting said two overlapping pulses, and wherein said pair of continuous out-of-phase clock signals are received at capture and launch inputs of said L1/L2-latch 1, L1/L2-latch 2, and L2-Star latch.

9. The clock controller of claim 8, wherein said waveform shaper circuitry comprises a first waveform shaper and a second waveform shaper, each waveform shaper receiving one pulse of said two overlapping pulses from said L2-Star latch, and wherein each waveform shaper comprises a delay and AND logic, said delay receiving said one pulse and outputting a delayed version thereof, and said AND logic receiving said one pulse and said delayed version thereof and outputting therefrom a shorter pulse, wherein said delay is sized so that the shorter pulses output from said first and second waveform shapers are non-overlapping.

10. The clock controller of claim 5, wherein said single pair of clock pulses are provided to CPIN and BPIN inputs of a clock splitter circuit of a logic system which is to undergo AC self-test.

11. A method for generating a single pair of clock pulses, said method comprising:

generating two overlapping pulses from a continuous clock signal and a DC input signal, said generating being responsive to said DC input signal going high; and shaping said two overlapping pulses to produce two non-overlapping pulses at clock speed, said two non-overlapping pulses at clock speed comprising a single pair of clock pulses, wherein said single pair of clock pulses are useful in AC self-testing a logic system driven by said continuous clock signal without discontinuing said continuous clock signal.

12. The method of claim 11, further in combination with a method for AC self-testing the logic system employing said single pair of clock pulses.

13. The method of claim 11, further comprising generating a pair of continuous out-of-phase clock signals from said continuous clock signal, and using said pair of continuous out-of-phase clock signals and said DC input signal to generate said two overlapping pulses.

14. The method of claim 11, wherein said shaping comprises outputting said single pair of clock pulses to CPIN and BPIN inputs of a clock splitter circuit of the logic system which is to undergo AC self-testing.

15. The method of claim 11, wherein said single pair of clock pulses are spaced at approximately clock speed of said continuous clock signal.

16. A method of AC self-test timing analysis of a logic system, said method comprising:

scanning a set of data into at least some latches of the logic system;

generating a single pair of clock pulses at operating frequency without gating off an oscillator used to drive the logic system; and employing the single pair of clock pulses to launch scanned in data from a first set of latches and capture the data at a second set of latches of the logic system.

17. The method of claim 16, further comprising scanning out captured data and checking the integrity of the data.

18. The method of claim 16, wherein said generating comprises:

generating two overlapping pulses from said oscillator used to drive the logic system and from a DC input signal, said generating being responsive to said DC input signal going high; and shaping the two overlapping pulses to produce two non-overlapping pulses at clock speed, said two non-overlapping pulses at clock speed comprising said single pair of clock pulses.

19. The method of claim 18, wherein said generating comprises employing multi-stage latch circuitry to generate said two overlapping pulses from a single continuous clock signal.

20. The method of claim 16, wherein said employing comprises providing said pair of clock pulses to CPIN and BPIN inputs of a clock splitter circuit of the logic system undergoing AC self-testing.

* * * * *